US009112523B1

(12) United States Patent
Ford et al.

(10) Patent No.: US 9,112,523 B1
(45) Date of Patent: Aug. 18, 2015

(54) MULTIPLYING DIGITAL TO ANALOG CONVERTER (MDAC) WITH ERROR COMPENSATION AND METHOD OF OPERATION

(71) Applicants: Alex A. Ford, Austin, TX (US); Robert S. Jones, III, Austin, TX (US)

(72) Inventors: Alex A. Ford, Austin, TX (US); Robert S. Jones, III, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/291,355

(22) Filed: May 30, 2014

(51) Int. Cl.
H03M 1/06 (2006.01)
H03M 1/08 (2006.01)
H03M 1/36 (2006.01)
H03K 3/013 (2006.01)

(52) U.S. Cl.
CPC ............ *H03M 1/0845* (2013.01); *H03K 3/013* (2013.01); *H03M 1/36* (2013.01)

(58) Field of Classification Search
CPC ........... H03M 1/06; H03M 1/66; H03M 1/74; H03M 1/164; H03M 1/167; H03M 1/804; H03M 1/004; H03M 1/007; H03M 1/0607; H03M 1/0604; H03M 1/0612; H03M 1/1225; H04L 25/08
USPC ......... 341/118, 144, 161, 110, 150, 156, 172; 375/349; 327/103, 73, 331
See application file for complete search history.

(56) References Cited

U.S. PATENT DOCUMENTS

| | | | | |
|---|---|---|---|---|
| 5,187,482 A * | 2/1993 | Tiemann et al. | ............... | 341/143 |
| 5,801,654 A * | 9/1998 | Traylor | ......................... | 341/144 |
| 6,346,908 B1 * | 2/2002 | Jones, III | ...................... | 341/172 |
| 6,469,957 B1 * | 10/2002 | Savord et al. | ................. | 367/137 |
| 7,268,720 B1 * | 9/2007 | Murden | ........................ | 341/161 |
| 8,581,769 B2 * | 11/2013 | Kumar et al. | ................. | 341/161 |
| 8,643,527 B2 * | 2/2014 | Kosic | ............................ | 341/161 |
| 8,659,459 B2 * | 2/2014 | Kim et al. | ..................... | 341/150 |
| 8,723,714 B2 * | 5/2014 | Liu et al. | ....................... | 341/161 |
| 8,779,963 B1 * | 7/2014 | Bales | ............................ | 341/161 |
| 8,830,099 B1 * | 9/2014 | Straayer et al. | .............. | 341/144 |
| 2011/0102216 A1 * | 5/2011 | Kiran et al. | .................... | 341/118 |

OTHER PUBLICATIONS

Figueiredo, M. et al., "Reference-Free CMOS Pipeline Analog-to-Digital Converters", Springer Science + Business Media, New York, 2013, pp. 66-69.
Goes, J. et al., "Switched-Capacitor Multiply-By-Two Amplifier Insensitive to Component Mismatches", IEEE Transactions on Circuits and Systems—II, Express Briefs, vol. 54, No. 1, Jan. 2007, pp. 29-33.
Pacheco, J. et al., "Design of a 10-bit 40 MS/s Pipelined ADC Using 1.5-bit with Current-Mode Reference Shifting", Mixed Design of Integrated Circuits and Systems (MIXDES), 2011 Proceedings of the 18th International Conference, Jun. 16-18, 2011, pp. 299-302.

(Continued)

Primary Examiner — Lam T Mai

(57) ABSTRACT

The present disclosure provides methods and circuits for compensating reference shifting error. A compensation reference voltage is applied to an error compensation circuit, which is coupled to a multiplying circuit. A compensation parasitic capacitance is induced in the error compensation circuit. The compensation parasitic capacitance is configured to negate a parasitic capacitance induced in the multiplying circuit.

20 Claims, 3 Drawing Sheets

(56) References Cited

OTHER PUBLICATIONS

Quinn, P. et al., "Capacitor matching insensitive 12-bit 3.3 MS/s algorithmic ADC in 0.25 μm CMOS", Proceedings of the IEEE 2003 Custom Integrated Circuits Conference, Sep. 2003, pp. 425-428.

Tabasy, Z., et al., "1.5-bit mismatch-insensitive MDAC with reduced input capacitive loading", Electronics Letters, vol. 45, Issue 23, Nov. 2009, pp. 1157-1158.

Wang, C. et al., "A capacitor-mismatch-insensitive switch-capacitor amplifier for Pipeline ADC", 7th International Conference on ASIC, Oct. 2007, pp. 473-476.

\* cited by examiner

MULTIPLYING DIGITAL TO ANALOG CONVERTER (MDAC) WITH ERROR COMPENSATION AND METHOD OF OPERATION

BACKGROUND

1. Field

This disclosure relates generally to integrated circuits, and more specifically, to a multiplying digital to analog converter (MDAC) with error compensation.

2. Related Art

Switched capacitor circuits are typically used for discrete time signal processing. A switched capacitor circuit operates by moving charges into and out of capacitors when switches are opened and closed. The switches may be controlled by non-overlapping clock signals. One application of a switched capacitor circuit is for a multiplying digital to analog converter (MDAC) which takes an input, adds a reference value to the input, and multiples this by a factor based on the capacitor ratios. However, switched capacitor circuits are sensitive to parasitic capacitances. These unwanted capacitances generally result in voltage inaccuracies at the output. These parasitic capacitances generally introduce errors relative to the input voltage (gain error) and the reference voltages (reference shifting error). Therefore, a need exists for an MDAC which compensates for parasitic capacitors relative to both the input voltage and the reference voltages.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Parasitic capacitances within an MDAC circuit introduce gain error (error relative to the input voltage) and reference shifting error (error relative to the reference voltages). Furthermore, these errors become more pronounced when the MDACs are used in a pipelined configuration, such as in an analog to digital converter (ADC), as the errors get multiplied from stage to stage. Therefore, in one embodiment, additional switched capacitors are included in the MDAC so as to reduce or eliminate both the gain error and the reference shifting error.

Figure 1:
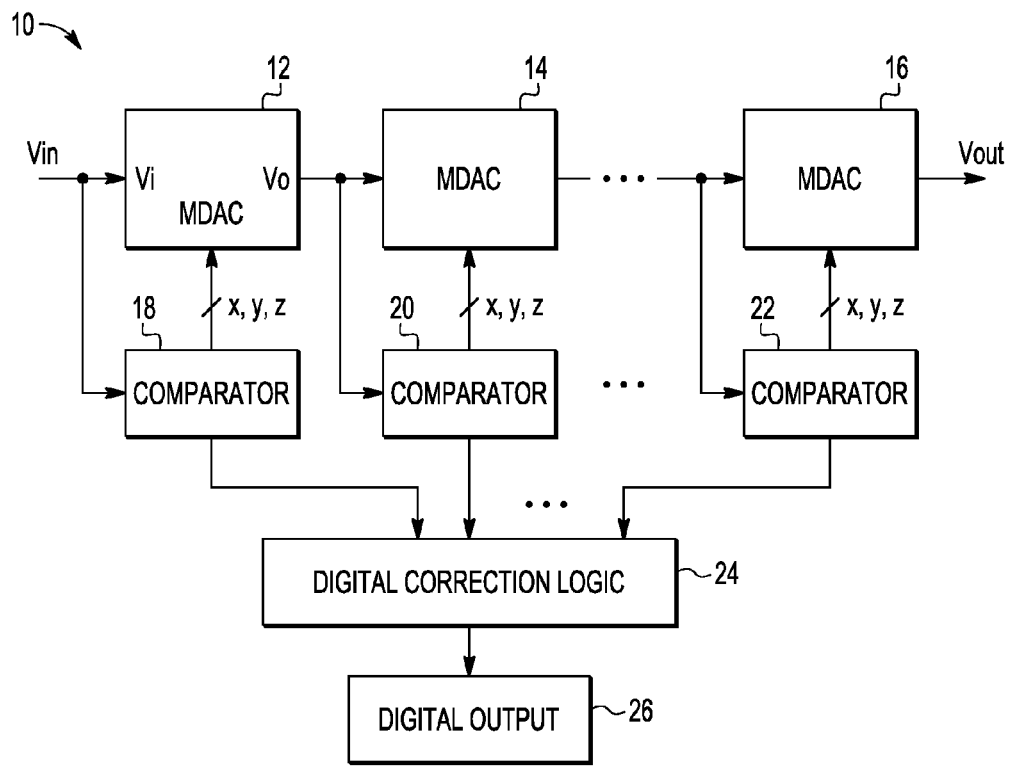
FIG. 1 illustrates, in block diagram form, a pipelined analog to digital converter (ADC) in accordance with an embodiment of the present invention.

FIG. 1 illustrates, in block diagram form, a pipelined analog to digital converter (ADC) 10 in accordance with one embodiment of the present invention. ADC 10 includes MDACs 12, 14, and 16 coupled in a pipeline. MDAC 12 is coupled to receive an input voltage, Vin, to ADC 10 and MDAC 16 provides an output voltage, Vout, at the output of ADC 10. Each MDAC, such as MDACs 12, 14, and 16, receives an input voltage and provides an output voltage. MDAC 12 receives Vin as its voltage input Vi and provides Vo as the output voltage to MDAC 14. The input voltage provided to each MDAC is also provided to a corresponding comparator. For example, the input voltage to MDAC 12 is also provided to comparator 18, and comparator 18 provides x, y, and z values to MDAC 12. The input voltage to MDAC 14 is also provided to comparator 20, and comparator 20 provides x, y, and z values to MDAC 14. The input voltage to MDAC 16 is also provided to comparator 22, and comparator 22 provides x, y, and z values to MDAC 16. Each comparator provides an output to digital correction logic 24 which provides a digital value to digital output 26. In this manner, an analog input, Vin, is converted to a digital output at digital output 26. Note that any number of MDACs may be connected in series, as indicated by the dotted lines between MDACs 14 and 16. The length of the pipeline determines the number of digits of digital output 26.

In operation, each stage of pipelined ADC 10 includes a comparator and an MDAC. In each stage, the comparator receives the input voltage and performs a quantization to provide one or more bits to digital correction logic 24 as well as output values x, y, and z to the MDAC, and the MDAC, based on the x, y, and z values and the input voltage, provides a residual amplified voltage at its output. The residual amplified voltage is provided for further quantization performed by subsequent stages of pipelined ADC 10. Digital correction logic 24 receives the quantization bits from the comparators and applies digital correction to provide digital output 26. Each stage of ADC 10 operates using a sampling and quantization phase during a first phase of a clock followed by an amplifying phase during a second phase of the clock. The amplifying attempts to restore the residue to the full voltage range of ADC 10. Therefore, as will be described below, each MDAC operates in accordance to a sampling phase during the first phase of the clock followed by an amplifying phase during the second phase of the clock.

Each MDAC receives an input voltage, Vi, and provides an output voltage Vo, in which Vo represents the amplified residual voltage determined by the MDAC. As will be seen below, the MDAC may be coupled to a reference voltage which may be, for example, $-Vref$, a common mode reference Vcm, or $+Vref$. Ideally, the MDAC provides Vo as $Vo = 2 \cdot Vin + B \cdot Vref$ in which B represents $-1$, 0, or 1 based on whether the MDAC is coupled to receive $-Vref$, Vcm, or $+Vref$, respectively.

Figure 2:
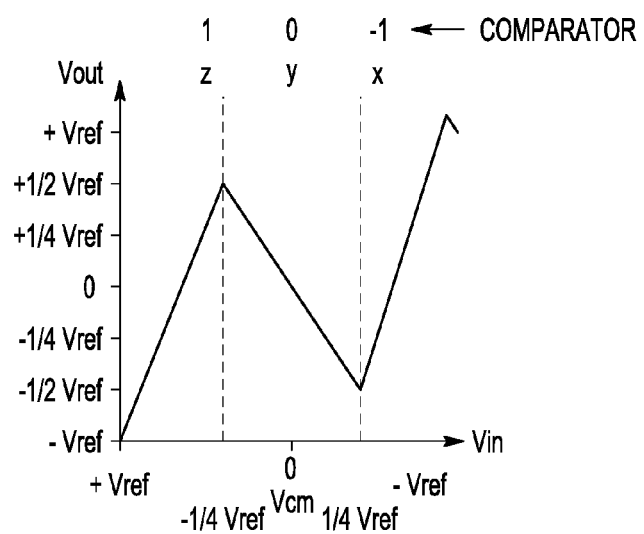
FIG. 2 illustrates, in diagrammatic form, the generation of output values, x, y, and z of a comparator of FIG. 1 in accordance with an embodiment of the present invention.

FIG. 2 illustrates, in diagrammatic form, the generation of output values, x, y, and z of a comparator of FIG. 1. For example, with respect to comparator 18, comparator 18 includes a set of comparators or comparison circuitry which determines the values of x, y, and z which keeps Vout bounded, i.e. within the range of $-Vref$ to $+Vref$. Therefore, as seen in reference to FIG. 2, if Vin falls between $-Vref$ and $-\frac{1}{4} Vref$, $z=1$ and each of y and x are 0 (which corresponds to $B=1$). If Vin falls between $-\frac{1}{4}$ Vref and $+\frac{1}{4}$ Vref, $y=1$ and each of z and x are zero (which corresponds to $B=0$). If Vin falls between $+\frac{1}{4}Vref$ and $+Vref$, $x=1$ and each of z and y are 0 (which corresponds to $B=-1$). The values x, y, and z may be referred to as reference voltage variables or switch control variables since, as will be described below, they will be used to select which reference voltage (e.g. $-Vref$, Vcm, or $+Vref$) will be coupled to portions of MDAC 12. Note that the same description applies to each comparator and corresponding MDAC within pipelined ADC 10.

Due to the effect of parasitic capacitances within each MDAC, errors are introduced when generating Vo. Therefore, rather than Vo=2·Vin+B·Vref as described for the ideal case, Vo includes both a gain error and a reference shifting error. The gain error affects the 2·Vin term and the reference shifting error affects the B·Vref term such that Vo=2·gain error·Vin+reference shifting error·B·Vref. Each MDAC includes a gain error compensation circuit which offsets the gain error introduced by parasitic capacitances. Each MDAC also includes a reference shifting error compensation circuit which offsets the reference shifting error introduced by parasitic capacitances. The reference shifting error compensation circuit, unlike the gain error compensation circuit, is configured to receive a compensation reference voltage, which may be −Vref, Vcm, or +Vref, based on the values of x, y, and z.

Figure 3:
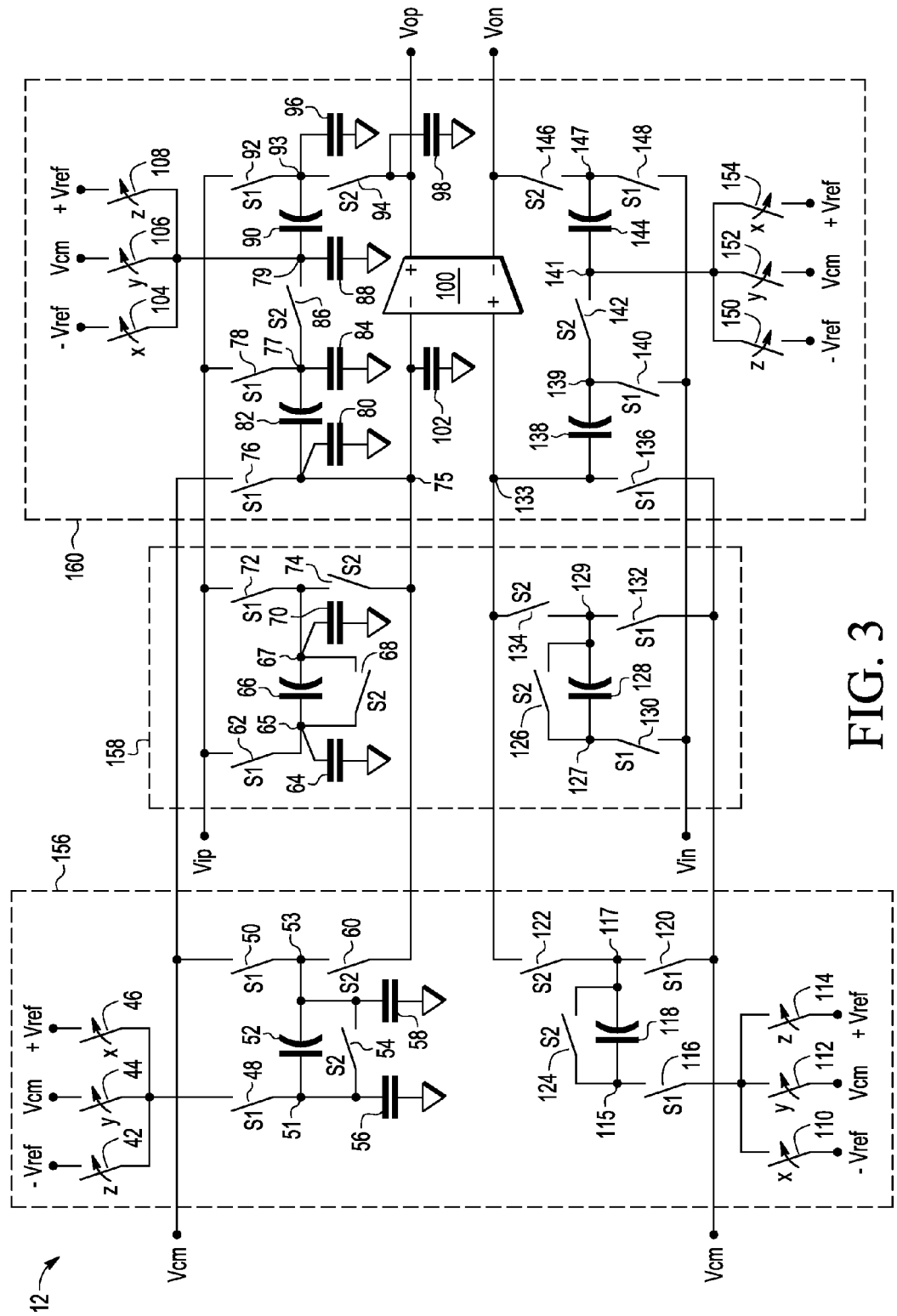
FIG. 3 illustrates, in circuit schematic form, a multiplying digital to analog converter (MDAC) in accordance with an embodiment of the present invention.

FIG. 3 illustrates, in schematic form, further details of MDAC 12, in accordance with one embodiment of the present invention. MDAC 12 includes a multiplying circuit 160, a gain error compensation circuit 158, and a reference shifting error compensation circuit 156. Note that each of the MDACs in pipelined ADC 10 may be the same. In the illustrated embodiment, MDAC 12 is a differential MDAC, in which input Vi for MDAC 12 is a differential signal including Vip and Vin and output Vo is a differential signal including Vop and Von. Note that, in reference to FIG. 1, if each MDAC is implemented as a differential MDAC, each comparator receives a differential input voltage. In the illustrated embodiment, capacitors illustrated with one straight line and one curved line correspond to actual circuit elements while capacitors illustrated with two parallel lines represent a parasitic capacitance introduced at a circuit node which may be associated, for example, with one or more capacitors. The parasitic capacitances may also be associated with circuit routing. Note that, for simplicity, the parasitic capacitances are only illustrated in the top portion (the "p" or positive portion) of MDAC 12 and not in the bottom portion. However, similar parasitic capacitances are induced in the bottom portion (the "n" or negative portion) as well.

Referring to FIG. 3, a switch 42 has a first current terminal coupled to receive −Vref, a control terminal coupled to receive z, and a second current terminal coupled to a first current terminal of an S1 switch 48. A switch 44 has a first current terminal coupled to receive Vcm, a control terminal coupled to receive y, and a second current terminal coupled to the first current terminal of switch 48. A switch 46 has a first current terminal coupled to receive +Vref, a control terminal coupled to receive x, and a second current terminal coupled to the first current terminal of switch 48. A second current terminal of switch 48 is coupled to circuit node 51. A first terminal of capacitor 52 is coupled to node 51 and a second terminal of capacitor 52 is coupled to a circuit node 53. A first current terminal of an S2 switch 54 is coupled to node 51, and a second terminal of switch 54 is coupled to node 53. A parasitic capacitance 56 is induced at node 51, and a parasitic capacitance 58 is induced at node 53. A first current terminal of an S1 switch 50 is coupled to receive Vcm, and a second current terminal of switch 50 is coupled to node 53. An S2 switch 60 has a first current terminal coupled to node 53 and a second current terminal coupled to a circuit node 75.

A switch 110 has a first current terminal coupled to receive −Vref, a control terminal coupled to receive x, and a second current terminal coupled to a first current terminal of an S1 switch 116. A switch 112 has a first current terminal coupled to receive Vcm, a control terminal coupled to receive y, and a second current terminal coupled to the first current terminal of switch 116. A switch 114 has a first current terminal coupled to receive +Vref, a control terminal coupled to receive z, and a second current terminal coupled to the first current terminal of switch 116. A second current terminal of switch 116 is coupled to circuit node 115. A first terminal of capacitor 118 is coupled to node 115 and a second terminal of capacitor 118 is coupled to a circuit node 117. A first current terminal of an S2 switch 124 is coupled to node 115, and a second terminal of switch 124 is coupled to node 117. A first current terminal of an S1 switch 120 is coupled to receive Vcm, and a second current terminal of switch 120 is coupled to node 117. An S2 switch 122 has a first current terminal coupled to node 117 and a second current terminal coupled to a circuit node 133.

Reference shifting error compensation circuit 156 of MDAC 12 includes switches 42, 44, 46, 48, 50, 54, and 60, capacitor 52, switches 110, 112, 114, 116, 120, 124, 122, and capacitor 118. The illustrated parasitic capacitances 56 and 58 are therefore induced by reference shifting error compensation circuit 156.

An S1 switch 62 has a first current terminal coupled to receive Vip, and a second current terminal coupled to a circuit node 65. A capacitor 66 has a first terminal coupled to node 65 and a second terminal coupled to node 67. An S2 switch 68 has a first current terminal coupled to node 65 and a second current terminal coupled to node 67. An S1 switch 72 has a first current terminal coupled to receive Vcm and a second current terminal coupled to node 67. A first current terminal of an S2 switch 74 is coupled to node 67 and a second current terminal of switch 74 is coupled to node 75. A parasitic capacitance 64 is induced by node 65, and a parasitic capacitance 70 is induced by node 67.

An S1 switch 130 has a first current terminal coupled to receive Vin, and a second current terminal coupled to a circuit node 127. A capacitor 128 has a first terminal coupled to node 127 and a second terminal coupled to node 129. An S2 switch 126 has a first current terminal coupled to node 127 and a second current terminal coupled to node 129. An S1 switch 132 has a first current terminal coupled to receive Vcm and a second current terminal coupled to node 129. A first current terminal of an S2 switch 134 is coupled to node 129 and a second current terminal of switch 134 is coupled to node 133.

Gain error compensation circuit 158 includes switches 62, 68, 72, 74, capacitor 66, switches 130, 126, 132, 134, and capacitor 128. The illustrated parasitic capacitances 64 and 70 are therefore induced by gain error compensation circuit 158.

A switch 104 has a first current terminal coupled to receive −Vref, a control terminal coupled to receive x, and a second current terminal coupled to a circuit node 79. A switch 106 has a first current terminal coupled to receive Vcm, a control terminal coupled to receive y, and a second current terminal coupled to node 79. A switch 108 has a first current terminal coupled to receive +Vref, a control terminal coupled to receive z, and a second current terminal coupled to node 79. An S1 switch 76 has a first current terminal coupled to receive Vcm, and a second current terminal coupled to node 75. A capacitor 82 has a first terminal coupled to node 75 and a second terminal coupled to a circuit node 77. An S1 switch 78 has a first current terminal coupled to receive Vip and a second current terminal coupled to node 77. An S2 switch 86 has a first current terminal coupled to node 77 and a second current terminal coupled to node 79. A capacitor 90 has a first terminal coupled to node 79 and a second terminal coupled to a circuit node 93. An S2 switch 94 has a first current terminal coupled to node 93 and a second current terminal coupled to a positive output of an amplifier 100, which provides output Vop. A negative input of amplifier 100 is coupled to node 75. A parasitic capacitance 80 is induced at node 75, a parasitic capacitance 84 is induced at node 77, a parasitic capacitance 88 is induced at node 79, a parasitic capacitance 96 is induced at node 93, a parasitic capacitance 98 is produce at Vop, and a parasitic capacitance 102 is induced at node 75.

A switch 150 has a first current terminal coupled to receive −Vref, a control terminal coupled to receive z, and a second current terminal coupled to a circuit node 141. A switch 152 has a first current terminal coupled to receive Vcm, a control terminal coupled to receive y, and a second current terminal coupled to node 141. A switch 154 has a first current terminal coupled to receive +Vref, a control terminal coupled to receive x, and a second current terminal coupled to node 141. An S1 switch 136 has a first current terminal coupled to receive Vcm, and a second current terminal coupled to node 133. A capacitor 138 has a first terminal coupled to node 133 and a second terminal coupled to a circuit node 139. An S1 switch 140 has a first current terminal coupled to receive Vin and a second current terminal coupled to node 139. An S2 switch 142 has a first current terminal coupled to node 139 and a second current terminal coupled to node 141. A capacitor 144 has a first terminal coupled to node 141 and a second terminal coupled to a circuit node 147. An S2 switch 146 has a first current terminal coupled to node 147 and a second current terminal coupled to a negative output of amplifier 100, which provides output Von. A positive input of amplifier 100 is coupled to node 133.

Figure 4:
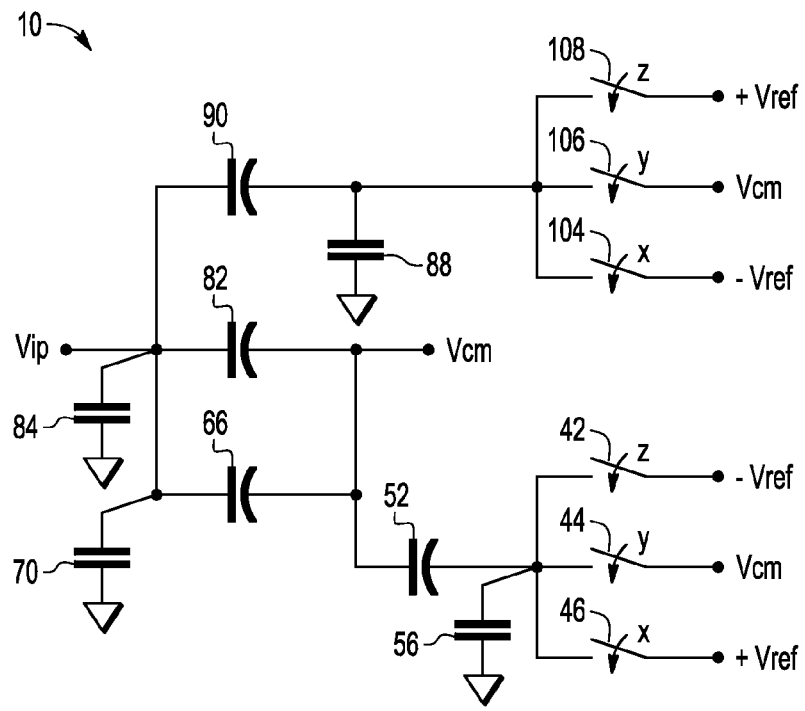
FIG. 4 illustrates, in circuit schematic form, a portion of the MDAC during a sampling phase of operation of the MDAC in accordance with an embodiment of the present invention.
Figure 5:
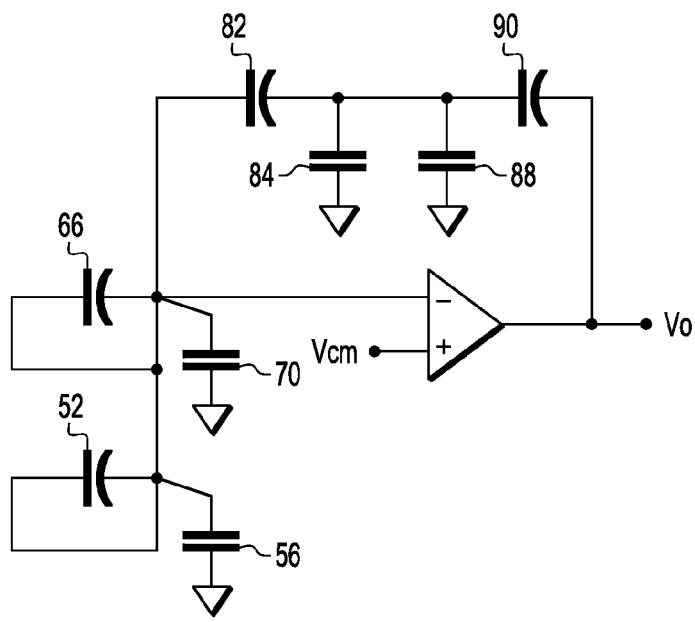
FIG. 5 illustrates, in circuit schematic form, a portion of the MDAC during an amplifying phase of operation of the MDAC in accordance with an embodiment of the present invention.

In operation, MDAC 12 operates in a accordance with a clock in which a first phase of the clock is referred to as the sampling phase and a second phase of the clock is referred to as the amplifying phase. Each of the S1 and S2 switches may be controlled by the clock such that, during the sampling phase, the S1 switches are closed and the S2 switches are open, and during the amplifying phase, the S1 switches are open and the S2 switches are closed. This results in a first topology of MDAC 12 during the sampling phase, as illustrated in FIG. 4, and a second topology of MDAC 12 during the amplifying phase, as illustrated in FIG. 5. Note that a single clock signal may be used to provide the controls to the S1 or S2 switches, or two non-overlapping clocks, 180 degrees out of phase, may be used. Alternatively, other clock schemes may be implemented to control the sampling phase and amplifying phase. For ease of explanation, although MDAC 12 is illustrated as a differential amplifier, operation will be described with respect to the top portion (the "p" portion), but one skilled in the art can appreciate that similar operation and analysis applies to the bottom portion (the "n" portion).

For MDAC 12, based on the value of Vin, comparators 18 provide the values of x, y, and z to MDAC 12 for controlling switches 104, 106, 108, 150, 152, 154, 42, 44, 46, 110, 112, and 114, as was described above in reference to FIG. 2. Note that x, y, and z are one-hot variables in that only one of x, y, and z is asserted based on the range of values in which Vin falls. Assuming that compensations circuits 156 and 158 were not present, multiplying circuit 160 operates as an MDAC without error compensation. During the sampling phase, the positive signal (Vip) is sampled on C90 and C82, and the negative signal is sampled on C144 and C138. This can be seen in the sampling phase topology illustrated FIG. 4 in which capacitors 66 and 52 and switches 42, 44, and 46 would not be present. During the residue amplifying phase, the voltage is summed across C90 and C82 and across C144 and C138, which results in an ideal transfer function of Vo=2·Vin+B·Vref, as was described above, in which B is −1,0, or 1 based on the one-hot variables x, y, and z. The one-hot variables close the appropriate switch of switches 104, 106, and 108, and the appropriate switch of switches 150, 152, and 54. This can be seen in the amplifying phase topology illustrated FIG. 5 in which capacitors 66 and 52 would not be present. However, due to the effect of parasitic capacitances (such as Cp88), the output voltage is affected with both a gain error and a reference shifting error. For example, for the top portion of multiplying circuit 160, Vop would be provided in accordance with equation 1 below:

$$Vop = 2\left(1 + \frac{1}{4}\left(\frac{Cp88}{C90}\right)\right)Vin + \left(1 + \frac{1}{2}\left(\frac{Cp88}{C90}\right)\right)B \cdot Vref \qquad \text{Eq. 1}$$

In equation 1, note that $$\frac{1}{4}\left(\frac{Cp88}{C90}\right)$$

is the gain error and $$\frac{1}{2}\left(\frac{Cp88}{C90}\right)$$

is the reference shifting errors which are a function of the parasitic capacitances, such as Cp88. Note that an additional gain error and reference shifting error is also provided by the bottom portion of multiplying circuit 160 based on the parasitic capacitances.

Therefore, as illustrated in FIG. 3, gain error compensation circuit 158 is included to compensate for the gain error and reference shifting error compensation circuit 156 is included to compensate for the reference shifting error. With these error compensation circuits, the top portion of multiplying circuit 160 provides Vop in accordance with equation 2 below:

$$Vop = \qquad \text{Eq. 2}$$
$$2\left(1 + \frac{1}{4}\left(\frac{Cp88}{C90} - \frac{Cp70}{C90} - \frac{Cp70}{C82} - \frac{Cp88 \cdot Cp70}{C90 \cdot C82} - \frac{Cp84 \cdot Cp70}{C90 \cdot C82}\right)\right.$$
$$Vin + \left(1 + \frac{1}{2}\left(\frac{Cp88}{C90} - \frac{Cp56}{C90} - \frac{Cp56}{C82} - \right.\right.$$
$$\left.\left.\frac{Cp88 \cdot Cp56}{C90 \cdot C82} - \frac{Cp84 \cdot C56}{C90 \cdot C82}\right)\right)B \cdot Vref$$

That is, each compensation circuit adds additional capacitors which result in additional parasitic capacitances to compensate for the error. For example, the top portion of gain error compensation circuit 158 adds capacitor 66 (C66) which results in parasitic capacitances which offset or negate the dominant gain error term $$\left(\frac{Cp88}{C90}\right)$$

introduced by the dominant parasitic capacitance Cp88. In this manner, gain error compensation circuit 158 negates the gain error. The top portion of reference shifting error compensation circuit 156 adds capacitor 52 as well as switches 42, 44, and 46 which offset or negate the dominant reference shifting term introduced by the dominant parasitic capacitance Cp88.

During the sampling phase, as illustrated in FIG. 4, the selected reference voltage (−Vref, Vcm, or +Vref) which is sampled on C52 is the inverse of the reference voltage (+Vref, Vcm, or −Vref) which is sampled on C90. For example, if z=1, +Vref is sampled on C90 but −Vref is sampled on C52. Therefore, C52 is used to offset the resulting reference shifting error. Note that, as shown in FIGS. 5, C66 and C52 are each shorted during the amplifying phase by switches 68 and 54, respectively. Therefore, the charges stored on parasitic capacitance, Cp56, compensates the dominant parasitic capacitances Cp88 and Cp84.

By now it should be appreciated that there has been provided an MDAC, which may be used in an pipelined ADC, which includes additional capacitors to compensate for both gain error as well as reference shifting error. Also, in one embodiment, a two-phase non-overlapping clock may be used which may prevent the need for additional clock logic. Furthermore, due to the use of additional capacitors for each of the gain error compensation and reference shifting compensation, the MDACs are self-calibrating in which less reliance on digital correction logic 24 is required. Also, note that the MDAC described above may allow for reduced sensitivity to capacitor mismatch between C82 and C90.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, Any number of MDACs may be pipelined to implement ADC 10. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a multiplying digital to analog converter (MDAC) circuit includes a multiplying circuit configured to receive an input voltage and output an output voltage, wherein a first parasitic capacitance is induced in the multiplying circuit; and an error compensation circuit coupled to the multiplying circuit, wherein the error compensation circuit is configured to receive a compensation reference voltage, a second parasitic capacitance is induced in the error compensation circuit, and the second parasitic capacitance is configured to negate the first parasitic capacitance. In one aspect, the first parasitic capacitance causes a reference shifting error that affects the output voltage, the second parasitic capacitance causes a compensation factor that further affects the output voltage, and the compensation factor is configured to negate the reference shifting error. In another aspect, the compensation reference voltage is selected from a set of voltages based on a range within which the input voltage falls. In another aspect, the compensation reference voltage is one of a set of voltages that includes a positive reference voltage, a common mode voltage, and a negative reference voltage. In another aspect, the multiplying circuit is configured to receive a reference voltage, and the compensation reference voltage is complementary to the reference voltage. In another aspect, the input voltage is a differential input voltage, the output voltage is a differential output voltage, and the compensation reference voltage is a differential reference voltage. In another aspect, the circuit further includes a second error compensation circuit coupled to the multiplying circuit and the error compensation circuit, wherein the second error compensation circuit is configured to receive the input voltage and a common mode voltage, a third parasitic capacitance is induced in the multiplying circuit, a fourth parasitic capacitance is induced in the second error compensation circuit, and the fourth parasitic capacitance is configured to negate the third parasitic capacitance. In another aspect, the first and second parasitic capacitances are induced during a first clock phase, and the first and second parasitic capacitances affect the output voltage during a second clock phase. In a further aspect, the first clock phase is a sampling phase, and the second clock phase is an amplifying phase. In another aspect of the above embodiment, the MDAC circuit is used in a pipelined analog to digital converter.

A multiplying digital to analog converter (MDAC) circuit includes a multiplying circuit, wherein the multiplying circuit is configured to receive an input voltage and output an output voltage; and an error compensation circuit coupled to the multiplying circuit, wherein the error compensation circuit includes a first topology during a first phase, wherein the first topology includes a first compensation capacitor coupled between a first node and a second node, the first node is coupled to a common mode voltage node via a first switch that is closed, the second node is coupled to a compensation reference voltage node via a second switch that is closed, the first node and the second node are coupled to a third switch that is open, the second node and a third node of the multiplying circuit are coupled to a fourth switch that is open, the third node has a first parasitic capacitance, and the second node has a compensation parasitic capacitance, and a second topology during a second phase, wherein the second topology includes a first connection between the first node and the second node formed by the third switch that is closed, the first and second switches are open, a second connection between the second node and the third node formed by the fourth switch that is closed, and the compensation parasitic capacitance negates the first parasitic capacitance. In one aspect, the multiplying circuit includes an amplifier configured to output the output voltage, and the second connection between the second node and the third node is coupled to an input terminal of the amplifier. In another aspect, the compensation reference voltage is complementary to a reference voltage applied in the multiplying circuit. In another aspect, the input voltage is a differential input voltage, the output voltage is a differential output voltage, and the reference voltage is a differential reference voltage. In another aspect, the circuit further includes a second error compensation circuit coupled to the multiplying circuit and the error compensation circuit, wherein the second error compensation circuit includes a third topology during the first phase, wherein the third topology includes a first capacitor coupled between a fourth node and a fifth node, the fourth node is coupled to the common mode voltage node via a fifth switch that is closed, the fifth node is coupled to the input voltage via a sixth switch that is closed, the fourth node and the fifth node are coupled to a seventh switch that is open, the fourth node and the third node of the multiplying circuit are coupled to a eighth switch that is open, the third node has a second parasitic capacitance, and the fifth node has a second compensation parasitic capacitance; and a fourth topology during the second phase, wherein the fourth topology includes a third connection between the fourth node and the fifth node formed by the seventh switch that is closed, the fifth and sixth switches are open, a fourth connection between the fourth node and the third node formed by the eighth switch that is closed, and the second compensation parasitic capacitance negates the second parasitic capacitance. In another aspect, the error compensation circuit further includes the compensation reference voltage node coupled to a positive reference voltage via a fifth switch, coupled to a common mode voltage via a sixth switch, and coupled to a negative reference voltage via a seventh switch, and the fifth, sixth, and seventh switches controlled by a switch control according to a value of the input voltage.

In another embodiment, a method for compensating reference shifting error includes applying a compensation reference voltage to an error compensation circuit, wherein the error compensation circuit is coupled to a multiplying circuit; inducing a compensation parasitic capacitance in the error compensation circuit during a first phase of the error compensation circuit; and introducing the compensation parasitic capacitance to the multiplying circuit during a second phase of the error compensation circuit, wherein the compensation parasitic capacitance is configured to negate a parasitic capacitance induced in the multiplying circuit. In one aspect, the parasitic capacitance causes a reference shifting error that affects an output voltage produced by the multiplying circuit, the compensation parasitic capacitance causes a compensation factor that further affects the output voltage, and the compensation factor is configured to negate the reference shifting error. In another aspect, the compensation reference voltage is complementary to a reference voltage applied to the multiplying circuit. In another aspect, the method further includes determining the compensation reference voltage based on an input voltage applied to the multiplying circuit, wherein the determining the compensation reference voltage further includes determining a particular range of voltages within which the input voltage falls, wherein the particular range is associated with a compensation reference voltage variable; and selecting the compensation reference voltage from a set of voltages based on the compensation reference voltage variable.

What is claimed is:

1. A multiplying digital to analog converter (MDAC) circuit comprising:
    a multiplying circuit configured to receive an input voltage and output an output voltage, wherein
        a first parasitic capacitance is induced in the multiplying circuit; and
    an error compensation circuit coupled to the multiplying circuit, wherein
        the error compensation circuit is configured to receive a compensation reference voltage,
        a second parasitic capacitance is induced in the error compensation circuit, and
        the second parasitic capacitance is configured to negate the first parasitic capacitance.

2. The MDAC circuit of claim 1, wherein
the first parasitic capacitance causes a reference shifting error that affects the output voltage,
the second parasitic capacitance causes a compensation factor that further affects the output voltage, and
the compensation factor is configured to negate the reference shifting error.

3. The MDAC circuit of claim 1, wherein
the compensation reference voltage is selected from a set of voltages based on a range within which the input voltage falls.

4. The MDAC circuit of claim 1, wherein
the compensation reference voltage is one of a set of voltages that includes a positive reference voltage, a common mode voltage, and a negative reference voltage.

5. The MDAC circuit of claim 1, wherein
the multiplying circuit is configured to receive a reference voltage, and
the compensation reference voltage is complementary to the reference voltage.

6. The MDAC circuit of claim 1, wherein
the input voltage is a differential input voltage,
the output voltage is a differential output voltage, and
the compensation reference voltage is a differential reference voltage.

7. The MDAC circuit of claim 1, further comprising
a second error compensation circuit coupled to the multiplying circuit and the error compensation circuit, wherein
    the second error compensation circuit is configured to receive the input voltage and a common mode voltage,
    a third parasitic capacitance is induced in the multiplying circuit,
    a fourth parasitic capacitance is induced in the second error compensation circuit, and
    the fourth parasitic capacitance is configured to negate the third parasitic capacitance.

8. The MDAC circuit of claim 1, wherein
the first and second parasitic capacitances are induced during a first clock phase, and
the first and second parasitic capacitances affect the output voltage during a second clock phase.

9. The MDAC circuit of claim 8, wherein
the first clock phase is a sampling phase, and
the second clock phase is an amplifying phase.

10. The MDAC circuit of claim 1, wherein the MDAC circuit is used in a pipelined analog to digital converter.

11. A multiplying digital to analog converter (MDAC) circuit comprising:
    a multiplying circuit, wherein
        the multiplying circuit is configured to receive an input voltage and output an output voltage; and
    an error compensation circuit coupled to the multiplying circuit, wherein the error compensation circuit includes
a first topology during a first phase, wherein the first topology includes
a first compensation capacitor coupled between a first node and a second node,
the first node is coupled to a common mode voltage node via a first switch that is closed,
the second node is coupled to a compensation reference voltage node via a second switch that is closed,
the first node and the second node are coupled to a third switch that is open,
the second node and a third node of the multiplying circuit are coupled to a fourth switch that is open,
the third node has a first parasitic capacitance, and the second node has a compensation parasitic capacitance, and
a second topology during a second phase, wherein the second topology includes
a first connection between the first node and the second node formed by the third switch that is closed,
the first and second switches are open,
a second connection between the second node and the third node formed by the fourth switch that is closed, and
the compensation parasitic capacitance negates the first parasitic capacitance.

12. The MDAC circuit of claim 11, wherein
the multiplying circuit includes an amplifier configured to output the output voltage, and
the second connection between the second node and the third node is coupled to an input terminal of the amplifier.

13. The MDAC circuit of claim 11, wherein
the compensation reference voltage is complementary to a reference voltage applied in the multiplying circuit.

14. The MDAC circuit of claim 11, wherein
the input voltage is a differential input voltage,
the output voltage is a differential output voltage, and
the reference voltage is a differential reference voltage.

15. The MDAC circuit of claim 11, further comprising
a second error compensation circuit coupled to the multiplying circuit and the error compensation circuit, wherein
the second error compensation circuit includes
a third topology during the first phase, wherein the third topology includes
a first capacitor coupled between a fourth node and a fifth node,
the fourth node is coupled to the common mode voltage node via a fifth switch that is closed,
the fifth node is coupled to the input voltage via a sixth switch that is closed,
the fourth node and the fifth node are coupled to a seventh switch that is open,
the fourth node and the third node of the multiplying circuit are coupled to a eighth switch that is open,
the third node has a second parasitic capacitance, and
the fifth node has a second compensation parasitic capacitance; and
a fourth topology during the second phase, wherein the fourth topology includes
a third connection between the fourth node and the fifth node formed by the seventh switch that is closed,
the fifth and sixth switches are open,
a fourth connection between the fourth node and the third node formed by the eighth switch that is closed, and
the second compensation parasitic capacitance negates the second parasitic capacitance.

16. The MDAC circuit of claim 11, wherein the error compensation circuit further comprises
the compensation reference voltage node coupled to a positive reference voltage via a fifth switch, coupled to a common mode voltage via a sixth switch, and coupled to a negative reference voltage via a seventh switch, and
the fifth, sixth, and seventh switches controlled by a switch control according to a value of the input voltage.

17. A method for compensating reference shifting error, the method comprising:
applying a compensation reference voltage to an error compensation circuit, wherein the error compensation circuit is coupled to a multiplying circuit;
inducing a compensation parasitic capacitance in the error compensation circuit during a first phase of the error compensation circuit; and
introducing the compensation parasitic capacitance to the multiplying circuit during a second phase of the error compensation circuit, wherein
the compensation parasitic capacitance is configured to negate a parasitic capacitance induced in the multiplying circuit.

18. The method of claim 17, wherein
the parasitic capacitance causes a reference shifting error that affects an output voltage produced by the multiplying circuit,
the compensation parasitic capacitance causes a compensation factor that further affects the output voltage, and
the compensation factor is configured to negate the reference shifting error.

19. The method of claim 17, wherein
the compensation reference voltage is complementary to a reference voltage applied to the multiplying circuit.

20. The method of claim 17, further comprising
determining the compensation reference voltage based on an input voltage applied to the multiplying circuit, wherein the determining the compensation reference voltage further comprises
determining a particular range of voltages within which the input voltage falls, wherein
the particular range is associated with a compensation reference voltage variable; and
selecting the compensation reference voltage from a set of voltages based on the compensation reference voltage variable.

* * * * *